United States Patent [19]
Lealman et al.

[11] Patent Number: 5,838,025
[45] Date of Patent: *Nov. 17, 1998

[54] ELECTRICAL BARRIER STRUCTURE FOR SEMICONDUCTOR DEVICE DOPED WITH CHROMIUM AND/OR TITANIUM

[75] Inventors: Ian Francis Lealman; Michael James Robertson; Michael John Harlow; Paul Charles Spurdens; William James Duncan, all of Suffolk, United Kingdom

[73] Assignee: British Telecommunications public limited company, London, England

[ * ] Notice: This patent issued on a continued prosecution application filed under 37 CFR 1.53(d), and is subject to the twenty year patent term provisions of 35 U.S.C. 154(a)(2).

[21] Appl. No.: 591,476

[22] PCT Filed: Jul. 11, 1994

[86] PCT No.: PCT/GB94/01498

§ 371 Date: Jan. 29, 1996

§ 102(e) Date: Jan. 29, 1996

[87] PCT Pub. No.: WO95/02910

PCT Pub. Date: Jan. 26, 1995

[30] Foreign Application Priority Data

Jul. 12, 1993 [EP] European Pat. Off. .............. 93305447

[51] Int. Cl.$^6$ .................................................. H01L 33/00
[52] U.S. Cl. ............................ 257/102; 257/103; 257/94; 372/46
[58] Field of Search ................................. 257/12–15, 17, 257/18, 94, 96, 102, 103; 372/45, 46, 43

[56] References Cited

U.S. PATENT DOCUMENTS

| | | | |
|---|---|---|---|
| 4,947,400 | 8/1990 | Dutta | 372/50 |
| 5,048,038 | 9/1991 | Brennan et al. | 372/46 |

FOREIGN PATENT DOCUMENTS

| | | |
|---|---|---|
| 0314372 | 5/1989 | European Pat. Off. . |
| 0426239 | 5/1991 | European Pat. Off. . |
| 0523587 | 1/1993 | European Pat. Off. . |
| 8804849 | 6/1988 | WIPO . |

OTHER PUBLICATIONS $3^{rd}$ International Conference on Indium Phosphide and Related Materials, 8–11 Apr. 1991, Cardiff, Wales, UK, pp. 208–211, J.M. Jowett et al, "The growth of MQW planar buried heterostructure lasers with semi–insulating blocking layers by OMVPE".

Patent Abstracts of Japan, vol. 16, No. 224 (E–1206) 25 May 1992 & JP A 04 038 880, 10 Feb. 1992, Toshihiro et al.

Patent Abstracts of Japan, vol. 11, No. 127, (E–501) (2574) 21 Apr. 1987 & JP A 61 271 886, 2 Dec. 1986, Yoshinori et al.

Electronics Letters, vol. 25, No. 15, 20 Jul. 1989, Stevenage GB, pp. 998–990, Y. Sakakibara et al, "Very narrow spectral lindwidth of GaInAs MQW–DFB–PPIBH laser diodes".

*Primary Examiner*—Minh-Loan Tran
*Attorney, Agent, or Firm*—Nixon & Vanderhye P.C.

[57] ABSTRACT

A semiconductor device, preferably a laser device such as a signal generator, a signal amplifier or a signal detector e.g. a distributed feedback laser, which is implemented in III/V semiconductors. Such devices often require a barrier layer to encourage current flow to pass through the localised p/n-interface and this invention provides the barrier layer in the form of a layer of hole trapping semiconductor material located between and in contact with two p-type layers. III/V semiconductors contain at least one of indium, gallium and aluminum and at least one of phosphorus and arsenic but the preferred devices are laser devices implemented in various types of indium phosphide except for the active zone wherein photons are generated. The active zone is preferably formed of ternary and/or quaternary semiconductors. In the preferred structures the barrier layer is formed of chromium doped indium phosphide which is located between two layers of p-type indium phosphide. Alternative structures have (a) titanium doped indium phosphide between two layers of p-type indium phosphide.

25 Claims, 3 Drawing Sheets

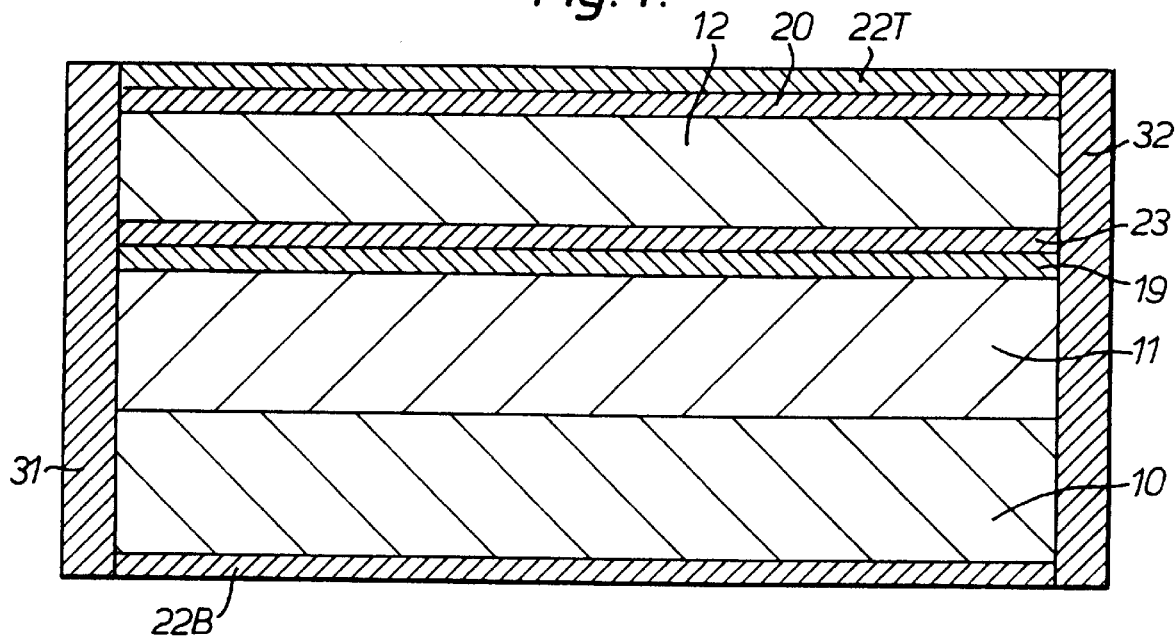
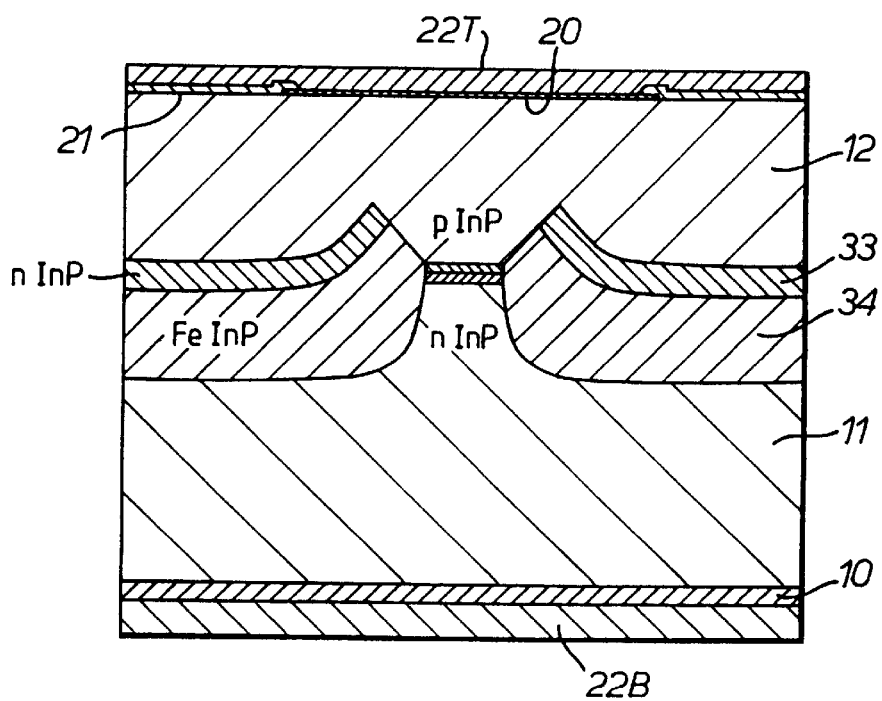

ELECTRICAL BARRIER STRUCTURE FOR SEMICONDUCTOR DEVICE DOPED WITH CHROMIUM AND/OR TITANIUM

BACKGROUND OF THE INVENTION

1. Field of the Invention

This invention relates to semiconductor devices and especially to laser structures which structures include barrier regions to regulate the flow of electric current in order to enhance the performance of the device.

The invention includes purely electronic devices, which utilise a barrier layer in order to preferentially channel current through an active region. However, the preferred devices are laser devices in which the barrier layers modify the flow of current in order to improve the efficiency, eg. the efficiency of conversion of electric power into radiated power. The barrier has a secondary effect in that the laser device is able to operate at higher rates of modulation.

The laser devices mentioned above can be utilised to carry out a variety of different telecommunications and signalling functions.

For example, the laser device can be utilised to generate optical signals. For this application, the laser device needs to be associated with a reflective or resonating structure which returns photons into the active region in order to sustain the lasing process. Resonating systems which are highly wavelength selective are particularly appropriate since they narrow the bandwidth of the optical signals which are generated. External resonating systems may be utilised or the resonating system may be incorporated into the lasing structure, eg. as in a distributed feedback laser. Cleaved facets, as in Fabry-Perot lasers may also be used for feedback.

The laser device may also be utilised for other signalling and telecommunication functions, e.g. optical amplifiers and optical detectors. In devices of this nature reflections are undesirable since they tend to produce noise. Therefore, it is appropriate to provide the lasing device with anti-reflection coatings in order to reduce, and ideally to eliminate, reflections.

2. Description of Related Art

From the above description, it will be recognised that there are a wide variety of electronic and opto-electronic semiconductor devices which require barrier layers to control the flow of current, (e.g. as described in 3rd International Conference on Indium Phosphide & Related Materials, Jowett et al "The Growth of MQW Planar Buried Heterostructure Lasers with Semi-Insulating Blocking Layers by OMVPE"; April 1991 pp 208–211). In particular, it is necessary to provide barrier layers in semiconductor devices wherein the semiconductors contain at least one of indium, gallium and aluminium and at least one of phosphorous and arsenic. In addition to the five major elements just mentioned the semiconductors also contain small quantities of dopants in order to confer particular electrical properties, e.g. p-type conduction or n-type conduction. Semiconductor structures wherein the various layers contain at least one of the elements indium, gallium and aluminium and at least one of the elements arsenic and phosphorus (together with dopants needed to provide the appropriate electrical function) are conveniently called III/V-devices.

The device structures usually include localised p/n-junctions where n-type regions contact p-type regions and, in order to encourage flow through a localised junction it is appropriate to provide an electrical barrier elsewhere. This invention relates to the electrical barrier.

SUMMARY OF THE INVENTION

It has been recognised that III/V semiconductor materials can be doped to trap either holes or electrons. For example, indium phosphide doped with chromium and/or titanium traps holes whereas indium phosphide doped with iron traps electrons. In such doped semiconductors that part of the conduction which depends on the trapped species is low but their performance as a barrier is disappointing, e.g. they permit more current flow than is desirable.

This invention is based on the discovery that the barrier properties of trapping III/V semiconductor regions are substantially improved when said region is located between and in contact with two III/V semiconductor regions each of the opposite type to the centre region. It will be appreciated that a barrier is usually required between p-type and n-type regions and in such a location the barrier is inherently in contact with one p-type and one n-type layer. Thus, the structure of the invention is not inherently provided because, on one side, the trapping layer is in contact with material of the same type as itself. In these circumstances, it is necessary to provide an extra layer of p-type material located between said hole-trapping region and the n-type region in order to achieve the desired configuration.

The invention, which is more fully defined in the claims, includes III/V semiconductor devices having an electrical barrier configured as a region of a hole trapping semiconductor located between and in contact with each of two p-type semiconductor regions. In many devices the electrical barrier is located between regions implemented in variously doped forms of indium phosphide and, in such locations, it is convenient that all parts of the barrier be implemented in various types of indium phosphide.

It is now appropriate to comment on the factors affecting the concentration of the dopant used for trapping. It is undesirable to risk jeopardising the crystal structure by the use of very high concentrations of dopant, e.g. if the dopant is not uniformly distributed or if the single crystal structure of the device is disrupted. It appears that there is an upper threshold for the concentration of the dopant. Below this upper threshold, higher concentrations appear to increase the trapping effect but there appears to be little, if any, extra trapping to be gained by increasing the concentration of the dopant above its upper threshold. Nevertheless, it is often appropriate to use concentrations which exceed the upper threshold, e.g. 1 to 50 times or even 1 to 100 times the upper threshold, in order to ensure that a maximum effect is obtained.

It should be recognised that there is a solubility limit for the dopant in the semiconductor. At and below this limit the composition is uniform and stable, but the composition may still be metastable at even substantially greater concentrations, e.g. up to 100 times as mentioned above. The preferred configuration in accordance with the invention takes the form of a layer of hole-trapping indium phosphide, eg chromium or titanium doped indium phosphide, located between and in contact with two layers of p-type indium phosphide.

It is emphasised that both chromium and titanium are good for the trapping of holes in indium phosphide. Chromium is more convenient than titanium for use in metal organic vapour phase epitaxy (MOVPE) deposition. For example, bisbenzene chromium, $(C_6H_6)_2Cr$, is an organometallic compound which is convenient for use as a reagent in MOVPE. This reagent causes no side effects or problems and the chromium does not engage in any unacceptable side reactions under the conditions which appertain in an MOVPE reactor. As mentioned, chromium traps holes in indium phosphide sufficiently to give effective barriers in accordance with the invention. The preferred concentration range of chromium is $10^{15}$–$10^{19}$ atoms/cc and the solubility limit is about $2\times10^{16}$ atoms/cc.

Titanium is even more effective than chromium in trapping holes in indium phosphide; possibly because indium phosphide will tolerate higher concentrations of titanium. Titanium forms tetrakis(dimethylamino)titanium, Ti[N(CH$_3$)$_2$]$_4$, which is suitable for use in MOVPE reactions. However, titanium is more reactive than chromium and, even at the low level of impurities acceptable in MOVPE reaction systems, it is possible for titanium to engage in unwanted side reactions. These side reactions can be reduced to an acceptable level but this requires extremes of technique and carefulness from the operators and, because of the reactivity of titanium, the preferred dopant is chromium.

The III/V devices in accordance with the invention are particularly suitable for implementation as laser devices which include an active zone wherein the generation of photons actually occurs. A wide variety of different active zones are known for different purposes. For example the active zone may be homogenous or it may contain several different thin layers as in multi-quantum well structures and strained super-lattice structures. (In a multi-quantum well structure the thickness of the layers is selected to produce quantum effects whereas in a strained super-lattice the layers have different crystallographic parameters in order to produce a strained lattice which affects the performance in a desired manner. It is possible to have an active region which is both multi-quantum well and strained super-lattice.) In many cases the active zone is implemented in ternary semiconductors, eg. containing indium and gallium with arsenic or phosphorus or quaternary semiconductors, ie. containing all four of indium, gallium, phosphorus and arsenic. It will be appreciated that a multi-layered structure will contain at least two different compositions, eg. ternary and quaternary layers. The active zone is usually located close to a p/n-junction but, in some cases, the active zone includes the p/n-junction. In many devices a substantial proportion of the volume, eg. except for the active zone and for contact layers, is implemented in various forms of doped indium phosphide.

BRIEF DESCRIPTION OF THE DRAWINGS

The invention will now be described by way of example with reference to the accompanying drawings in which:

FIG. 3b is an enlargement, showing greater detail of the indicated cart of FIG. 3a: and FIG. 4 illustrates in longitudinal cross-section, the device of FIG. 1 implemented as an optical amplifier with anti-reflection coatings.

FIG. 5, which is for comparison, is a transverse cross-section illustrating a buried heterostructure which includes an iron doped barrier region.

DETAILED DESCRIPTION OF THE DRAWINGS

Figure 1:
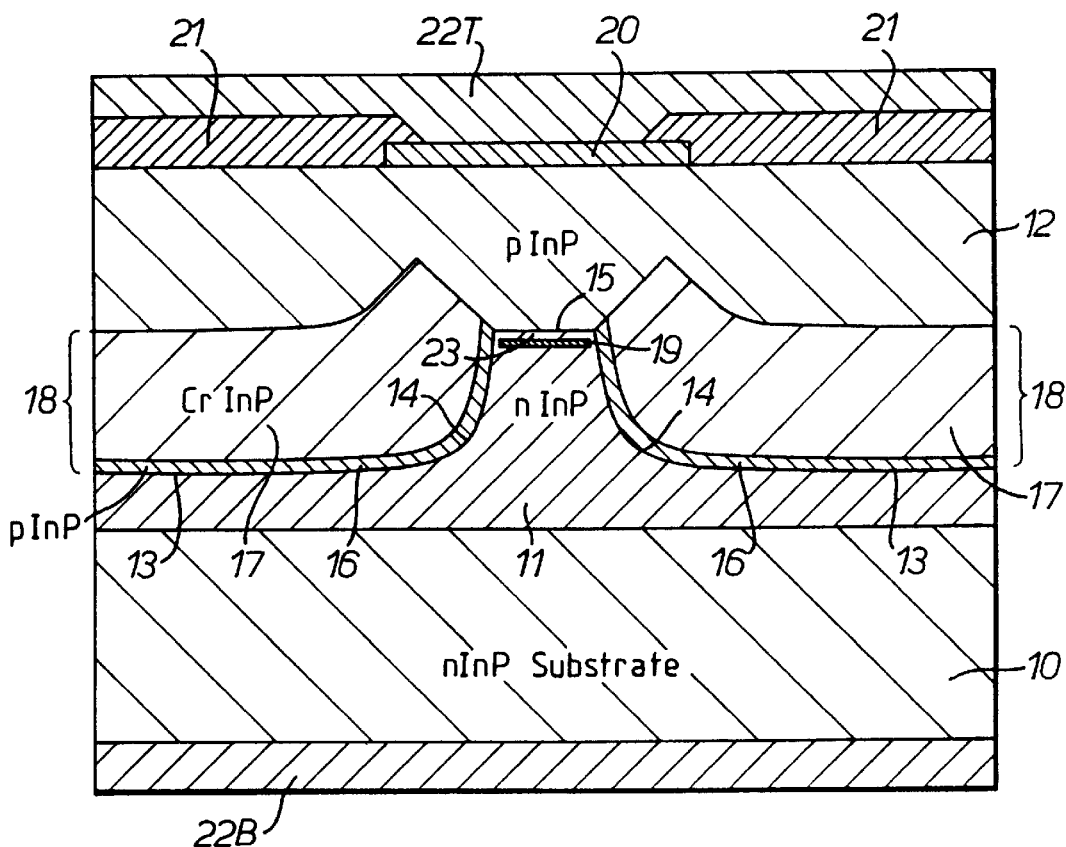
FIG. 1 is a transverse cross-section illustrating a buried heterostructure which includes a barrier region in accordance with the invention.

As shown in FIG. 1, the device comprises a substrate 10 formed of n-type InP and, supported thereon a first region 11 which is also formed of n-type InP. Region 11 supports an active zone 19 and p-doped layer 23.

Regions 11, 19 and 23 are shaped as a mesa which projects into a second region 12 which is formed of p-type InP. The mesa is two-sided and each side has a base 13 with a curve 14 connecting to the plateau 15 of the mesa.

The active zone 19 is where the generation of photons occurs. The p/n junction of the device is within or close to the active zone 19. Several compositional and locational possibilities exist for the active zone 19.

As regards location, the active zone 19 is on the first region 11 and one of its faces may be co-incident with the plateau 15. Alternatively, the active zone 19 may be below the plateau 15 (in which case the covering layer 23, of p-type InP, lies between the active zone 19 and the plateau 15). As regards composition, the active zone 19 may be homogenous or it may be formed of several layers, eg. it may be a multi-quantum well zone and/or a strained super lattice. Ternary semiconductors (containing both of indium and gallium and one of phosphorus and arsenic) and quaternary semiconductors (containing all four of indium, gallium, phosphorus and arsenic) are suitable for forming the active zone 19 or the various layers thereof.

Usually the active zone has a higher refractive index than its surroundings. Thus it acts as a confining region for the photons produced therein or, in the case of amplifiers and detectors, supplied from outside. Usually the active zone extends from one facet to the other and it constitutes a waveguide between these two facets.

As implied above, the p-type region of the device makes contact with the n-type region at a localised p/n-junction which is within or close to the active zone 19. For efficient operation, eg. for the efficient conversion of electric power into radiation, it is desirable to direct as much as possible of the electric current so that it flows through the active zone 19. In order to encourage this, it is desired to discourage the current flow elsewhere and a barrier region 18 is therefore located between the p-type and the n-type regions.

If the active zone 19 extends longitudinally throughout the structure the barrier region 18 consists of two separate sub-regions, ie. one on each side of the active zone 19. Each sub-region of the barrier 18 is formed of two layers, namely a thin layer 16 adjacent region 11 and a thicker layer 17 adjacent to region 12.

In the preferred embodiment, layer 16 is formed of p-type indium phosphide and layer 17 is formed of chromium doped indium phosphide. The chromium doping is at a concentration of $10^{18}$ atoms per cubic centimetre (ie. 50 times the upper threshold). The effect of the chromium doping is to make the hole conduction of layer 17 very low and it is very close to zero. It should be noted that the chromium doped layer 17 is located between and in contact with two p-type regions of indium phosphide. One of these regions is provided as region 12 (which is part of the operational structure) but the other, ie. layer 16, is an additional layer. It is emphasised that it is the combination of three layers, ie. 12, 16 and 17 which, in accordance with the invention provide good barrier properties. Without layer 16, electrons from layer 11 would be injected through layer 17 causing substantial conduction.

By way of comparison a different blocking structure is illustrated in FIG. 5. Basically this is the same as FIG. 1, but layers 16 and 17 are replaced by an iron doped layer 34 directly on layer 11 with a thin n-doped layer 33 directly above layer 34. Mostly this serves as a good blocking structure, ie it has an electron trapping layer located between two n-type layers. However, in the vicinity of the mesa plateau 15, there exists a region with p-type contacting directly to iron doped material. This allows substantial hole injection, and reduces the efficiency of the barrier. In the present invention shown in FIG. 1, there is no such equivalent injection path ie n-type to chromium doped material.

To complete fabrication of the device, an external contact is provided on top of second region 12. This consists of a central conductive stripe 20 located above the active zone 19 The stripe 20 is usually formed of InGaAs doped for high conductivity and it is in contact with second layer 12. Two silica regions 21 are located, one on each side of, the stripe 20. The silica constitutes an insulator. Finally a metallic terminal 22T covers the whole or part of the top surface. This metallic terminal makes electrical contact with the stripe 20 and it is conveniently formed of titanium and platinum and gold layers or titanium and gold layers.

A metallic terminal 22B also of titanium and gold layers is provided on the base of the substrate. When the device is in use, external contacts are soldered to these terminal layers 22T and 22B. It should be noted that the operational structure, ie. layers 10–19, is located between the external contacts, ie. items 20–22T and item 22B. The functional structure is formed of various types of III/V semiconductors.

A brief description of the preparation of the structure illustrated in FIG. 1 will now be given. This utilises conventional MOVPE, conventional masking and conventional photolithography. The preparation starts with the substrate 10 and, using conventional MOVPE techniques, the first region 11, the active zone 19 and the covering layer 23 are grown in sequence. At the end of the growth period the substrate 10 was covered by layers of uniform thickness providing the first region 11 and the various layers of the active zone 19 and the covering layer 23. Having grown layers of uniform thickness it is necessary to shape these to produce the mesa as illustrated in FIG. 1.

As a preliminary to shaping, 200 nm of silica were deposited and, using conventional photoresists, a protective stripe was placed above the intended plateau of the mesa. This allowed the side portions of the silica to be removed. This exposes the semiconductor which is etched to a depth of 2 µm.

The next step is to grow the barrier layers 16 and 17. During the growth of these layers the silica remains on the plateau of the mesa to prevent growth thereon. Layer 16, ie. 100–200 nm of zinc doped InP is grown on the base 13 and curved sides 14 of the mesa. After the deposition of layer 16, 2 µm of chromium doped InP was grown using bisbenzene chromium in a conventional bubbler to supply the chromium to the MOVPE reactor. At this stage the silica stripe was removed from the mesa using hydrofluoric acid and, after said removal, the region 12, ie. 1.5 µm of p-doped InP and region 20 were grown.

Finally the contact regions 21 and 22 were provided by conventional techniques.

Figure 2:
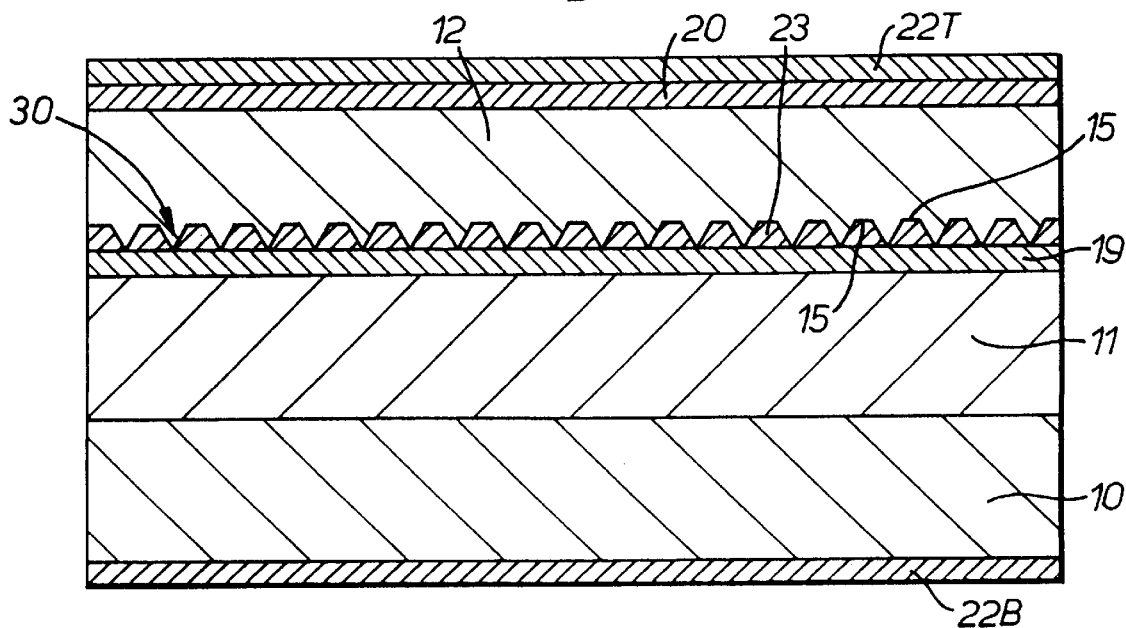
FIG. 2 is a longitudinal cross-section through a device as shown in FIG. 1 implemented as a distributed feedback laser.

FIG. 2 is a longitudinal cross-section through the active zone 19 of a DFB laser incorporating the structure as shown in FIG. 1. The barrier does not appear in FIG. 2 because it is not present in this cross section. However, this figure shows the location of a second order grating 30 providing resonance at a wavelength of 1.55 µm. It should be noted that the grating 30 can be provided in the covering layer 23.

Figure 3A:
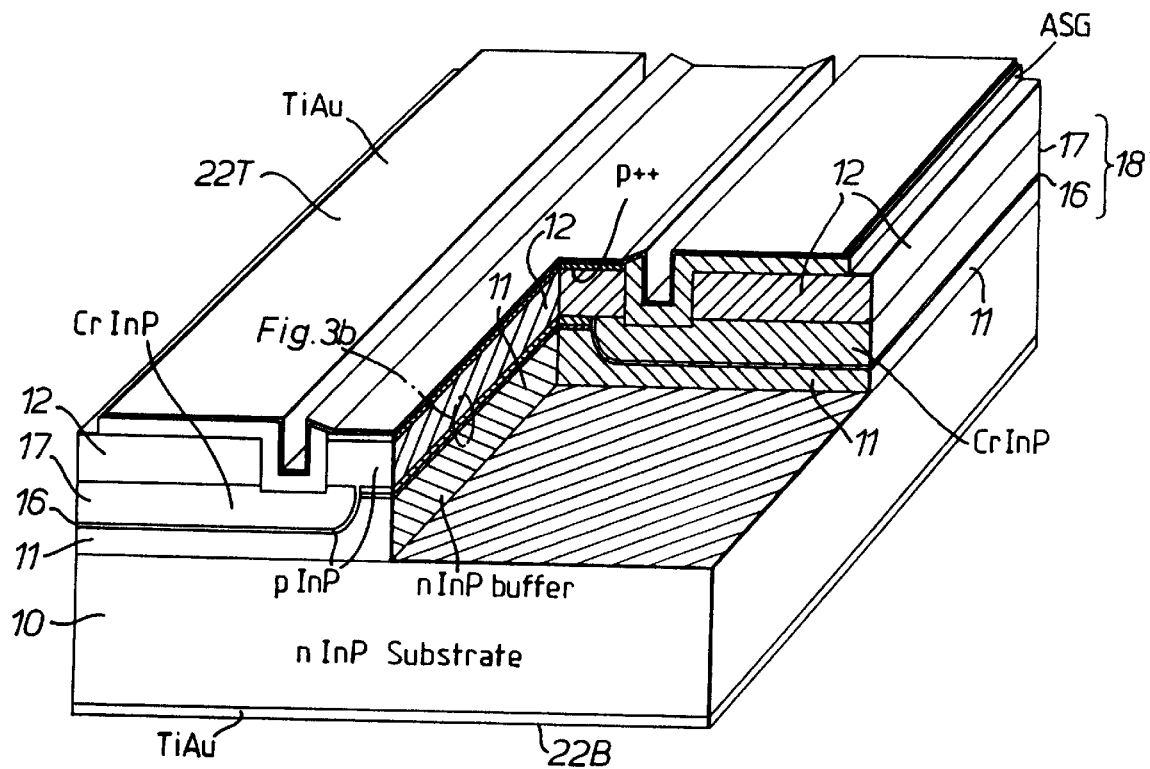
FIGS. 3a is perspective, partly cut away, view of the device illustrated in FIG. 2.
Figure 3B:
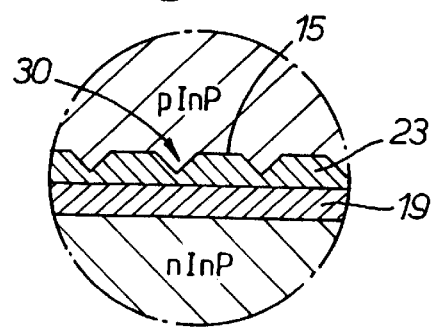

FIGS. 3a and 3b are cutaway perspective views showing the device of FIG. 2 in greater detail. Since all the parts have already been identified no further description is necessary.

FIG. 4 is a longitudinal cross-section through a device as shown in FIG. 1 but implemented as an optical amplifier. Since reflections are undesirable for this function there is no grating or any reflective or resonance system. Instead the end faces of the device are provided with anti-reflection coatings 31 and 32 so as to minimise reflections as much as possible. (Note. The anti-reflection coatings are conventional and their structure is usually multi layer. Some devices have only one antireflection coating.)

In order to illustrate the advantage of the invention, a laser according so the invention was compared with a laser similar to that shown in FIG. 1 but prepared using a single iron doped indium phosphide barrier instead of barrier layers 16 and 17. In other words the barrier is constituted by iron doped indium phosphide instead of the barrier in accordance with the invention.

Both lasers had a threshold bias current of 15 mA; ie. at bias currents below 15 mA no light output was produced. At bias currents of 15 mA very small light output is produced. but there is not enough output to display the advantage of the invention.

Table 1 contains comparative measurements for bias current in milliamps giving: -

Column 1: bias current in mA:

Column 2: light output in milliwatts for prior art (Fe),

Column 3: light output in milliwatts for the invention (Cr), and

Column 4: the percentage improvement.

$\{[(\text{col 3})-(\text{col 2})]/(\text{col 2})\}*100.$

TABLE 1

| mA | Fe | Cr | % |
|---|---|---|---|
| 40 | 3.2 | 4.0 | 25 |
| 60 | 5.0 | 6.8 | 36 |
| 80 | 7.2 | 9.8 | 36 |
| 100 | 8.6 | 12.2 | 41 |

Table 1 illustrates that the barrier layer in accordance with the invention is substantially better than the equivalent barrier of iron doped InP giving 30–40% improvements in the power of the light output for similar bias currents.

It is believed that a structure as shown in FIG. 5 would have a performance similar to column 2 of Table 1.

We claim:

1. A III/V semiconductor device which includes a p-type region and an n-type region with an electrical barrier located between said p-type region and said n-type region characterised in that said barrier takes the form of two layers of III/V semiconductor, namely a first layer doped with chromium adapted for trapping holes and a second layer of a p-type III/V semiconductor material wherein said first layer is between and in contact with said second layer and the p-type region of the device.

2. A device according to claim 1, wherein the first layer is formed of indium phosphide doped for hole trapping and it is in contact with two layers each of which is formed of p-type indium phosphide.

3. A device according to claim 1, which comprises first and second contact zones each of which includes a metal layer constituting an external contact of the device and a functional structure located between said first and second contact zones wherein said functional structure is formed of one or more regions each of which is formed of a semiconductor material which contains at least one of indium, gallium and aluminium and at least one of phosphorus and arsenic.

4. A semiconductor device according to claim 3, wherein the functional structure is a laser structure which comprises:
   (a) a localised p/n-junction;
   (b) an active zone wherein photons are generated, and wherein (a) is within or close to the active zone;
   (c) a region of p-type indium phosphide;
   (d) a region of n-type indium phosphide; and
   (e) an electrical barrier which is located between (c) and (d) so as to cause current to flow through (a) in preference to elsewhere;
   characterized in that:
      (e) comprises two layers (e1) and (e2),
      (e1) is formed of hole-suppressed indium phosphide doped with chromium;
      (e2) is formed of p-type indium phosphide;
      (c) is in contact with (e1),
      (e1) is also in contact with (e2), and
      (e2) is also in contact with (c)
      whereby (e1) is located between and in contact with two layers of p-type indium phosphide.

5. A device according to claim 4, wherein (e1) is formed of indium phosphide doped with chromium at a concentration between $10^{15}$ and $10^{19}$ atoms per cubic centimetre.

6. A device according to claim 4, wherein (b) has a uniform composition said composition being a doped semiconductor containing both of indium and gallium and at least one of phosphorus and arsenic.

7. A device according to claim 4, wherein (b) is formed of a plurality of layers of semiconductor materials to form either a quantum well structure and/or a strained super lattice wherein each of said layers is a semiconductor containing both of indium and gallium and at least one of phosphorus and arsenic.

8. A device according to claim 4, which is a burned heterostructure device having (b) located at or near a plateau of a mass projecting into (c).

9. A device according to claim 4, wherein the laser structure is a distributed feedback laser and said device includes a grating structure located for co-operation with (b).

10. A device according to claim 4 which is a Fabry-Perot laser device having two cleaved facets as reflectors.

11. A device according to claim 4, which is a semiconductor amplifier having anti-reflection coatings on one or both facets in order to suppress reflections.

12. A device according to claim 1 wherein the barrier comprises two separate subregions which define a gap in the barrier, a localised p/n junction located in the gap wherein the p-type region of the device contacts the n-type region of the device, and the p-type and n-type regions are separated elsewhere by the barrier.

13. A method of making a device as in claim 1 comprising forming the n-type region on a substrate;
   forming an active zone of semiconductor material on the n-type region;
   etching the active zone and the n-type region to form a mesa shaped structure;
   forming said electrical barrier on the mesa shaped structure; and
   providing the p-type region on the barrier layer and the active zone, whereby the first layer of the electrical barrier is located between and in contact with two layers of p-type semiconductor material of the device.

14. A III/V semiconductor device which includes a p-type region and an n-type region with an electrical barrier located between said p-type region and said n-type region characterized in that said barrier takes the form of two layers of III/V semiconductor, namely a first layer doped with titanium in the absence of iron adapted for trapping holes and a second layer of a p-type III/V semiconductor material wherein said first layer is between and in contact with said second layer and the p-type region of the device.

15. A device according to claim 14 wherein the first layer is formed of indium phosphide doped for hole trapping and it is in contact with two layers each of which is formed of p-type indium phosphide.

16. A device according to claim 14 which comprises first and second contact zones each of which includes a metal layer constituting an external contact of the device and a functional structure located between said first and second contact zones wherein said functional structure is formed of one or more regions each of which is formed of a semiconductor material which contains at least one of indium, gallium and aluminum and at least one of phosphorus and arsenic.

17. A semiconductor device according to claim 16 wherein the functional structure which comprises:
   (a) a localized p/n junction;
   (b) an active a zone wherein photons are generated, and wherein (a) is within or close to the active zone;
   (c) a region of p-type indium phosphide;
   (d) a region of n-type indium phosphide; and
   (e) an electrical barrier which is located between (c) and (d) so as to cause current to flow through (a) in preference to elsewhere;
   characterized in that:
      (e) comprises two layers (e1) and (e2);
      (e1) is formed of hole-suppressed indium phosphide doped with titanium in the absence of iron,
      (c) is in contact with (e1),
      (e1) is also in contact with (e2), and
      (e2) is also in contact with (c)
      whereby (e1) is located between and in contact with two layers of p-type indium phosphide.

18. A device according to claim 17 wherein (b) has a uniform composition said composition being a doped semiconductor containing both of indium and gallium and at least one of phosphorus and arsenic.

19. A device according to claim 17 wherein (b) is formed of a plurality of layers of semiconductor materials to form either a quantum well structure and/or a strained super lattice wherein each of said layers is a semiconductor containing both of indium and gallium and at least one of phosphorus and arsenic.

20. A device according to claim 17 which is a burned heterostructure device having (b) located at or near a plateau of a mass projecting into (c).

21. A device according to claim 17 wherein the laser structure is a distributed feedback laser and said device includes a grating structure located for co-operation with (b).

22. A device according to claim 17 which is a Fabry-Perot laser device having two cleaved facets as reflectors.

23. A device according to claim 17 which is a semiconductor amplifier having anti-reflection coatings on one or both facets in order to suppress reflections.

24. A device according to claim 14 wherein the barrier comprises two separate subregions which define a gap in the barrier, a localized p/n junction located in the gap wherein the p-type region of the device contacts the n-type region of the device, and the p-type and n-type regions are separated elsewhere by the barrier.

25. A method of making a device as in claim 14 comprising forming the n-type region on a substrate;

forming an active zone of semiconductor material on the n-type region;

etching the active zone and the n-type region to form a mesa shaped structure;

forming said electrical barrier on the mesa shaped structure; and providing the p-type region on the barrier layer and the active zone, whereby the first layer of the electrical barrier is located between and in contact with two layers of p-type semiconductor material of the device.

* * * * *